(12) United States Patent
Fukuo

(10) Patent No.: US 9,401,304 B2
(45) Date of Patent: Jul. 26, 2016

(54) PATTERNING METHOD FOR LOW-K INTER-METAL DIELECTRICS AND ASSOCIATED SEMICONDUCTOR DEVICE

(71) Applicant: SanDisk Technologies Inc., Plano, TX (US)

(72) Inventor: Noritaka Fukuo, Yokkaichi (JP)

(73) Assignee: SanDisk Technologies LLC, Plano, TX (US)

( * ) Notice: Subject to any disclaimer, the term of this patent is extended or adjusted under 35 U.S.C. 154(b) by 106 days.

(21) Appl. No.: 14/260,867

(22) Filed: Apr. 24, 2014

(65) Prior Publication Data
US 2015/0311112 A1 Oct. 29, 2015

(51) Int. Cl.
*H01L 21/4763* (2006.01)
*H01L 21/768* (2006.01)
*H01L 23/532* (2006.01)
*H01L 23/522* (2006.01)
*H01L 23/528* (2006.01)

(52) U.S. Cl.
CPC .... *H01L 21/76802* (2013.01); *H01L 21/76843* (2013.01); *H01L 21/76871* (2013.01); *H01L 21/76882* (2013.01); *H01L 23/5222* (2013.01); *H01L 23/5329* (2013.01); *H01L 23/53295* (2013.01); *H01L 23/5283* (2013.01); *H01L 2924/0002* (2013.01)

(58) Field of Classification Search
CPC ............. H01L 21/76802; H01L 21/7682; H01L 21/76835
USPC ................. 438/618, 626, 631; 257/E21.585
See application file for complete search history.

(56) References Cited

U.S. PATENT DOCUMENTS

| 5,464,794 | A | * | 11/1995 | Lur | .............. | H01L 21/76804 |
| | | | | | | 148/DIG. 161 |
| 6,071,804 | A | | 6/2000 | Gau | | |
| 6,303,431 | B1 | | 10/2001 | Linliu | | |
| 6,451,687 | B1 | | 9/2002 | Liu et al. | | |
| 6,756,301 | B2 | | 6/2004 | Gilton et al. | | |

(Continued)

OTHER PUBLICATIONS

Daamen, R., et al., Production of 150nm wide Air Gap Interconnects with a "Sacrificial Materials Approach" and a "Close-off Approach," Technical Note PR-Tn 2005/01109, Koninklijke Philips Electronics NV 2005, Issued: Dec. 2005, 25 pages.
Hatton, Benjamin D., et al., "Materials chemistry for low-k materials," Materials Today, vol. 9, No. 3, Mar. 2006, 10 pages.

(Continued)

*Primary Examiner* — Julia Slutsker
(74) *Attorney, Agent, or Firm* — Vierra Magen Marcus LLP

(57) ABSTRACT

Semiconductor fabrication techniques and associated semiconductor devices are provided in which conductive lines are separated by a low dielectric constant (low-k) material such as low-k film portions or air. An insulation layer such as SiO2 is etched to form raised structures. The structures are slimmed and a low-k material or sacrificial material is deposited. A further etching removes the material except for portions on sidewalls of the slimmed structures. A metal barrier layer and seed layer are then deposited, followed by a metal filler such as copper. Chemical mechanical polishing (CMP) removes portions of the metal above the raised structures, leaving only portions of the metal between the raised structures as spaced apart conductive lines. The sacrificial material can be removed by a thermal process, leaving air gaps. The raised structures provide strength while the air gap or other low-k material reduces capacitance.

16 Claims, 9 Drawing Sheets

(56) References Cited

U.S. PATENT DOCUMENTS

| | | |
|---|---|---|
| 7,125,790 B2 | 10/2006 | Low et al. |
| 7,256,127 B2 | 8/2007 | Gallagher et al. |
| 7,666,754 B2 | 2/2010 | Toma et al. |
| 8,325,529 B2 | 12/2012 | Huang et al. |
| 8,610,278 B1 * | 12/2013 | Ott .................. H01L 23/5222 257/379 |
| 2004/0127013 A1 | 7/2004 | Wu et al. |
| 2004/0137728 A1 * | 7/2004 | Gallagher .......... B81B 7/0006 438/689 |
| 2011/0217838 A1 * | 9/2011 | Hsieh ................ H01L 21/768 438/618 |
| 2012/0091561 A1 | 4/2012 | Van Velzen et al. |
| 2012/0241978 A1 * | 9/2012 | Mino ............... H01L 27/11519 257/775 |
| 2013/0069234 A1 * | 3/2013 | Lee ................ H01L 23/53238 257/751 |
| 2013/0214415 A1 | 8/2013 | Pachamuthu et al. |

OTHER PUBLICATIONS

Daamen, R., et al., "Air Gap Integration for the 45 nm Node and Beyond," Int. Interconnect Technology Conf., Jul. 2005, 3 pages.

Daamen, R., et al., "Multi-Level Air Gap Integration for 32/22nm nodes using a Spin-on Thermal Degradable Polymer and a SiOC CVD Hard Mask," Interconnect Technology Conf., Jul. 2007, 3 pages.

Kim, Nam Sung, et al., "Successful Fault Isolation of Bit line Leakage and Leakage Suppresion by ILD Optimization in Embedded Flash Memory," Proceedings of 12th IPFA, Singapore, May 2005, 5 pages.

Saraswat, Krishna, "Low-K Dielectrics," Dept. of Electrical Engineering, Stanford University, Retrieved on Mar. 20, 2014, [http://www.stanford.edu/class/ee311/NOTES/Interconnect%20Lowk.pdf], 12 pages.

Schulz, Stefan E., et al., "Integration of SiO2 Aerogel as ultra low k dielectric (ULK) into Copper Damascene Interconnects for RF Devices," Microelectronic Engineering, Jan. 2004, 4 pages.

* cited by examiner

PATTERNING METHOD FOR LOW-K INTER-METAL DIELECTRICS AND ASSOCIATED SEMICONDUCTOR DEVICE

BACKGROUND

The present technology relates to semiconductor fabrication techniques and to associated semiconductor devices.

Semiconductor devices typically have one or more metal layers in which conductive lines are formed. The conductive lines can supply control signals to various components of the semiconductor device. For example, a memory device may use bit lines which extend horizontally. However, as semiconductor devices become scaled down, conductive lines which are close to one another can have a significant capacitance which interferes with the ability to provide the control signals.

BRIEF DESCRIPTION OF THE DRAWINGS

Like-numbered elements refer to common components in the different figures.

DETAILED DESCRIPTION

The present technology relates to semiconductor fabrication techniques and to associated semiconductor devices in which conductive lines are separated by a low dielectric constant (low-k) material such as low-k film or air.

One approach to reducing the capacitance between conductive lines is to provide a low-k material between the conductive lines. This material is between metal lines, or between locations in which metal lines will be formed, and is therefore an inter-metal material. A low-k material is a material with a small dielectric constant relative to silicon dioxide (SiO2), which has k=3.9.

Figure 5:
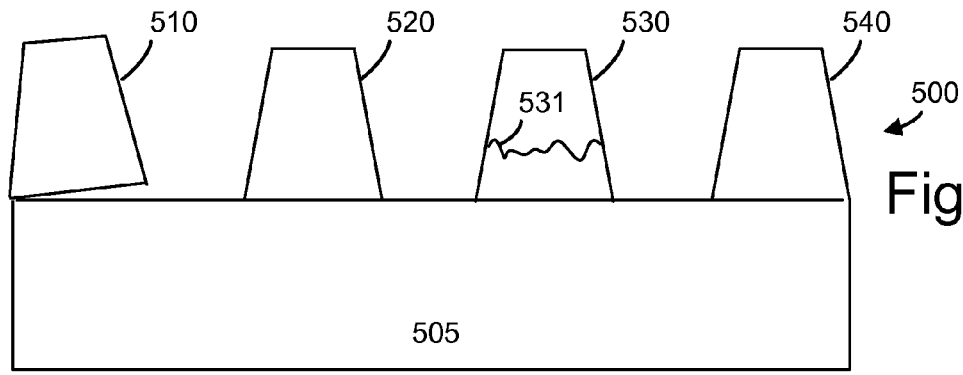
FIG. 5 depicts a semiconductor structure in which ridges formed of a low-k material are subject to poor adhesion and cracking.

However, some low-k materials exhibit properties such as weak adhesion which can lead to peeling, and weak mechanical strength which can lead to cracking and pattern collapse during wafer processing. For example, FIG. 5 depicts a semiconductor structure in which ridges 510, 520, 530 and 540 formed of a low-k material are formed on an insulation layer 505 such as SiO2. However, due to poor adhesion and mechanical strength, the ridge 510 does not adhere well to the insulation layer 505 and the ridge 531 has a crack 531. These problems can occur after additional processing is performed. These problems are especially fatal to a fine pitch structure.

Techniques provided herein include partial replacement of an existing pattern with a low-k material. These techniques decrease the capacitance between conductive lines while avoiding damage and defects. The techniques can be applied such as when creating a pattern of lines separated by spacers, where there is a fine pitch between the lines.

In one approach, after slimming an existing pattern, such as a pattern of ridges in an insulation layer such as SiO2, a low-k film is deposited. The slimmed ridges play the role of mandrels, e.g., work pieces on which the low-k material is deposited. The hardness of the pattern is maintained by the existence of the ridges and the fact that they are formed from an underlying insulation layer rather than being deposited on the insulation layer, as in FIG. 5. Moreover, the surface area with which the low-k film can contact the ridges is relatively large because the low-k film can contact sidewalls and bases of the ridges. As a result, there is good adhesion between the low-k film and the ridge. In contrast, in the example of FIG. 5, only the bottom surface of the ridges contacts the insulation layer.

Subsequently, a barrier metal layer, a metal seed layer and metal filler are deposited, and planarization is performed, such that the ridges separate the metal filler into conductive lines. Each ridge and the low-k material on opposing sides of the ridge provide a raised structure between adjacent conductive lines. The overall dielectric constant of the raised structure is a function of the dielectric constants of the ridge and of the low-k film. The overall dielectric constant is therefore controllable by adjusting the ratio of the width of the low-k film to the width of the slimmed ridge.

In another approach, a sacrificial material such as a thermally-degradable polymer is deposited on the ridges. The sacrificial material is removed by heating in a subsequent processing stage, such as after the conductive lines have been formed. This forms air gaps having k=1.

The techniques provided herein can be used in a wide variety of semiconductor devices in which it is desirable to reduce the capacitance between conductive regions of a semiconductor device. For example, it may be desirable to reduce the capacitance between elongated, spaced apart metal lines.

Such metal lines may be provided as bit lines in a non-volatile memory system, described below, in an example implementation.

Figure 1:
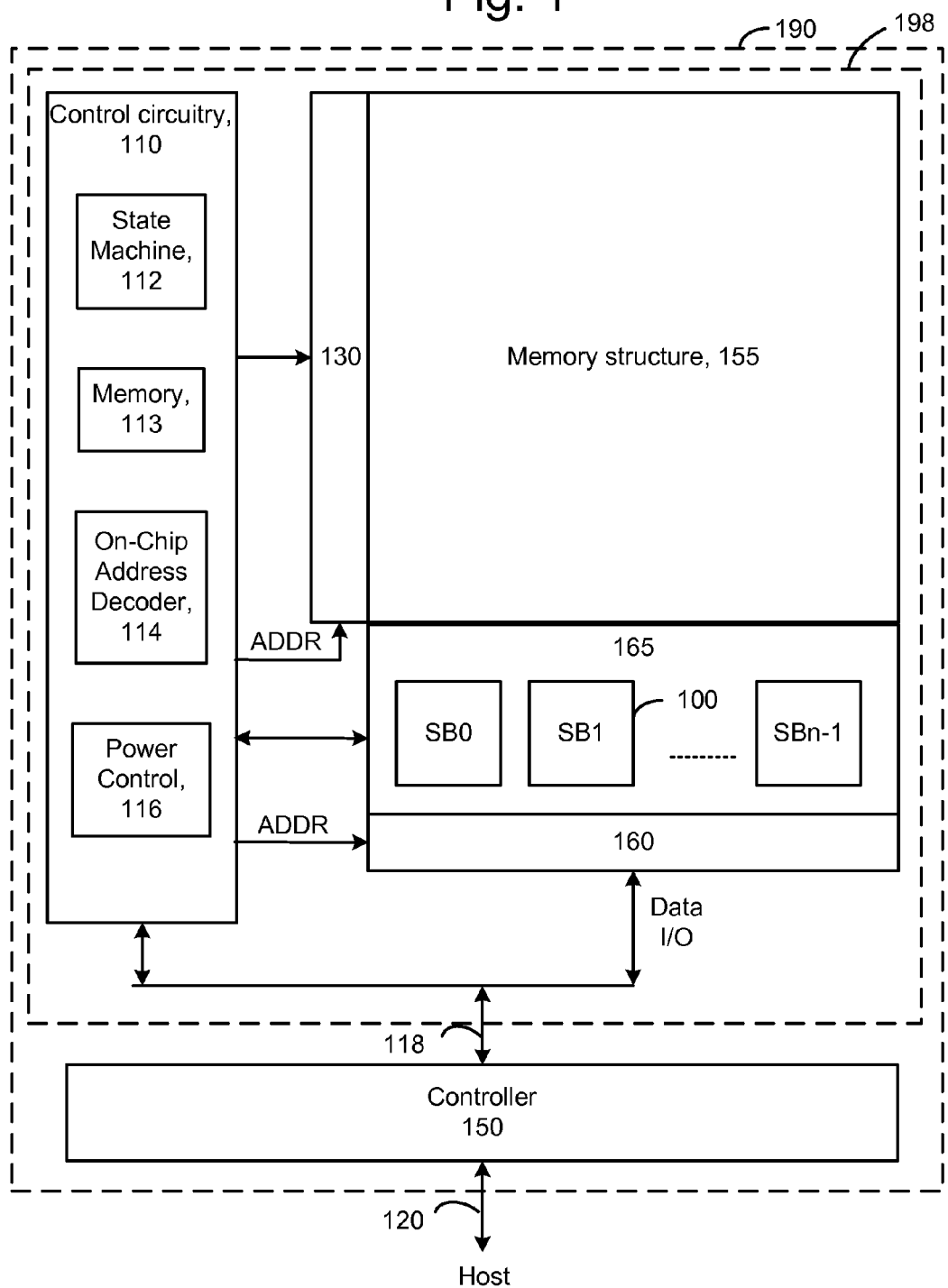
FIG. 1 is a block diagram of an example non-volatile memory system.

FIG. 1 is a block diagram of a non-volatile memory system. This system uses single row/column decoders and read/write circuits. The diagram illustrates a memory device 190 having read/write circuits for reading and programming a page of memory cells in parallel, according to one embodiment. Memory device 190 may include one or more memory die 198. Memory die 198 includes a memory structure 155 of memory cells or storage elements, control circuitry 110, and read/write circuits 165. The memory structure can be two-dimensional or three-dimensional, for example.

The memory structure 155 is addressable by word lines via a row decoder 130 and by bit lines via a column decoder 160. The read/write circuits 165 include multiple sense blocks 100 and allow a page of memory cells to be read or programmed in parallel. Typically a controller 150 is included in the same memory device 190 (e.g., a removable storage card) as the one or more memory die 198. Commands and data are transferred between the host and controller 150 via bus 120 and between the controller and the one or more memory die 198 via lines 118.

The control circuitry 110 cooperates with the read/write circuits 165 to perform memory operations on the memory structure 155, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 130 and 160. The power control module 116 controls the power and voltages supplied to the word lines and bit lines during memory operations. A memory 113 can store original write data, modified write data and status bits for use by the state machine as discussed further below.

One or more of the components (alone or in combination), other than memory structure 155, can be thought of as a managing or control circuit. For example, one or more control circuits may include any one of, or a combination of, control circuitry 110, state machine 112, address decoder 114, column decoder 160, power control module 116, sense blocks 100, read/write circuits 165, and controller 150, and so forth.

In another embodiment, a non-volatile memory system uses dual row/column decoders and read/write circuits. The various peripheral circuits access opposite sides of the memory structure 155 so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 155. In this way, the density of the read/write modules is essentially reduced by one half.

Figure 2A:
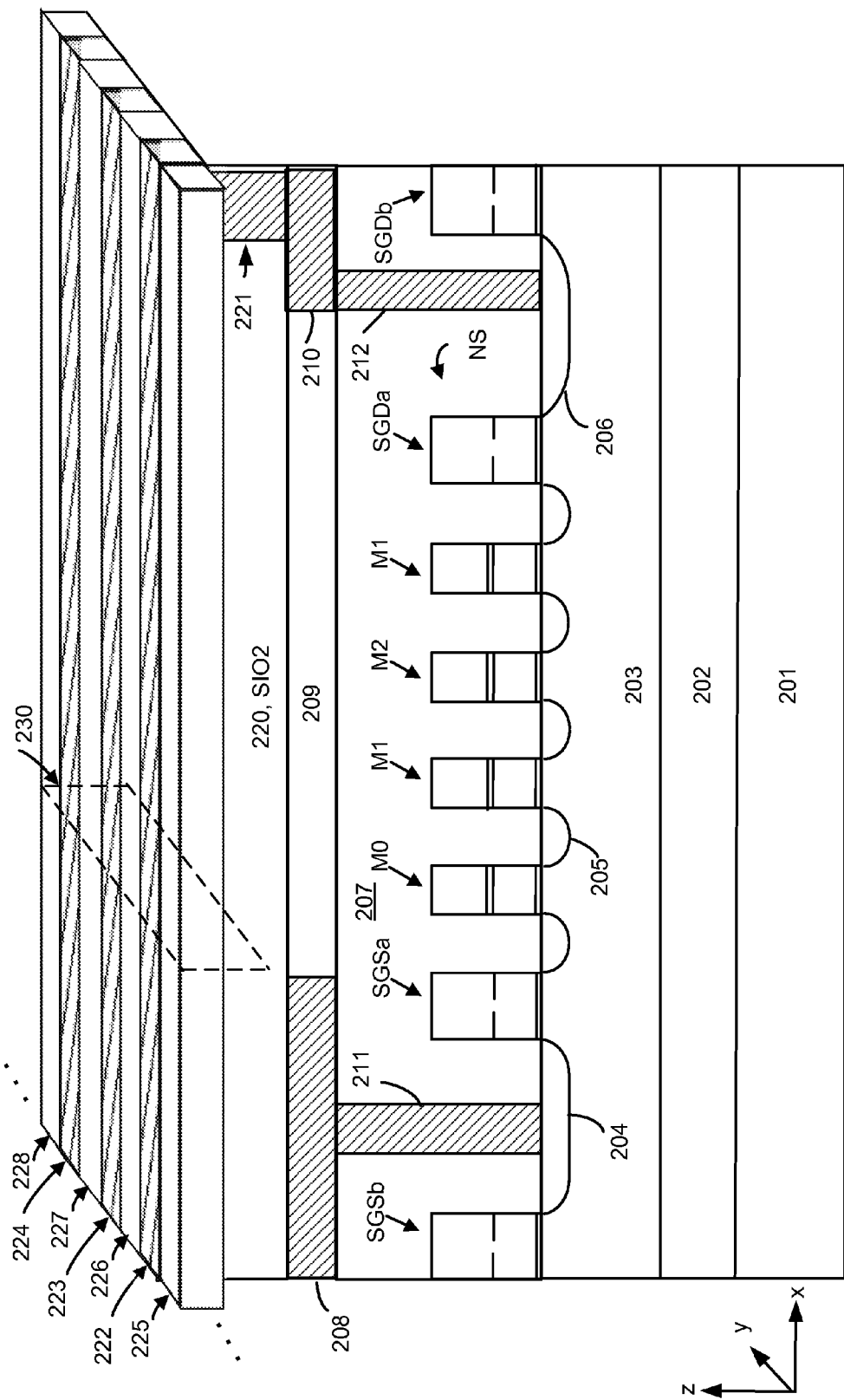
FIG. 2A depicts an example NAND string and set of bit lines in the memory structure of FIG. 1.

FIG. 2A depicts an example NAND string and set of bit lines in the memory structure of FIG. 1. A set of parallel NAND strings can be formed in a block. In this example, a NAND string (NS) is formed on a substrate 200 which includes a p-type substrate 201, an n-well region 202 and a p-well region 203. The substrate extends in an x-y plane and the bit lines are above the NAND strings in a z direction. The NAND string includes four memory cells M0, M1, M2 and M4, arranged between a source-side select gate (SGS) transistor, SGSa, and a drain-side select gate (SGD) transistor, SGDa. Portions of other NAND strings include SGSb and SGDb transistors. Example diffusion regions 204, 205 and 206 in the substrate are also depicted. The memory cells and select gate transistors are surrounded by an insulation 207. Above the insulation 207 is a layer which includes a source line 208, insulation 209, and a metal pad 210. The source line extends in the y direction and is common to each NAND string in the set, while the metal pad is specific to the NAND string NS. A vertical contact 211 extends between the source line and the diffusion region 204. A vertical contact 212 extends between the metal pad and the diffusion region 206.

An insulation layer 220 such as SiO2 is above the source line 208, insulation 209, and a metal pad 210. A vertical contact 221 extends between the metal pad 210 and a bit line 222 in a set of bit lines . . . , 222, 223, 224, . . . . The bit lines are examples of elongated conductive lines which extend horizontally, and which are parallel and spaced apart from one another. The bit lines are spaced apart from one another by dielectric regions 225, 226, 227 and 228. For instance, the dielectric regions can be formed as ridges with a low-k film or an air gap on opposing sides of each ridge, as described in further detail below. A cross-sectional area 230 is depicted in further detail in FIG. 4A-4I.

Figure 2B:
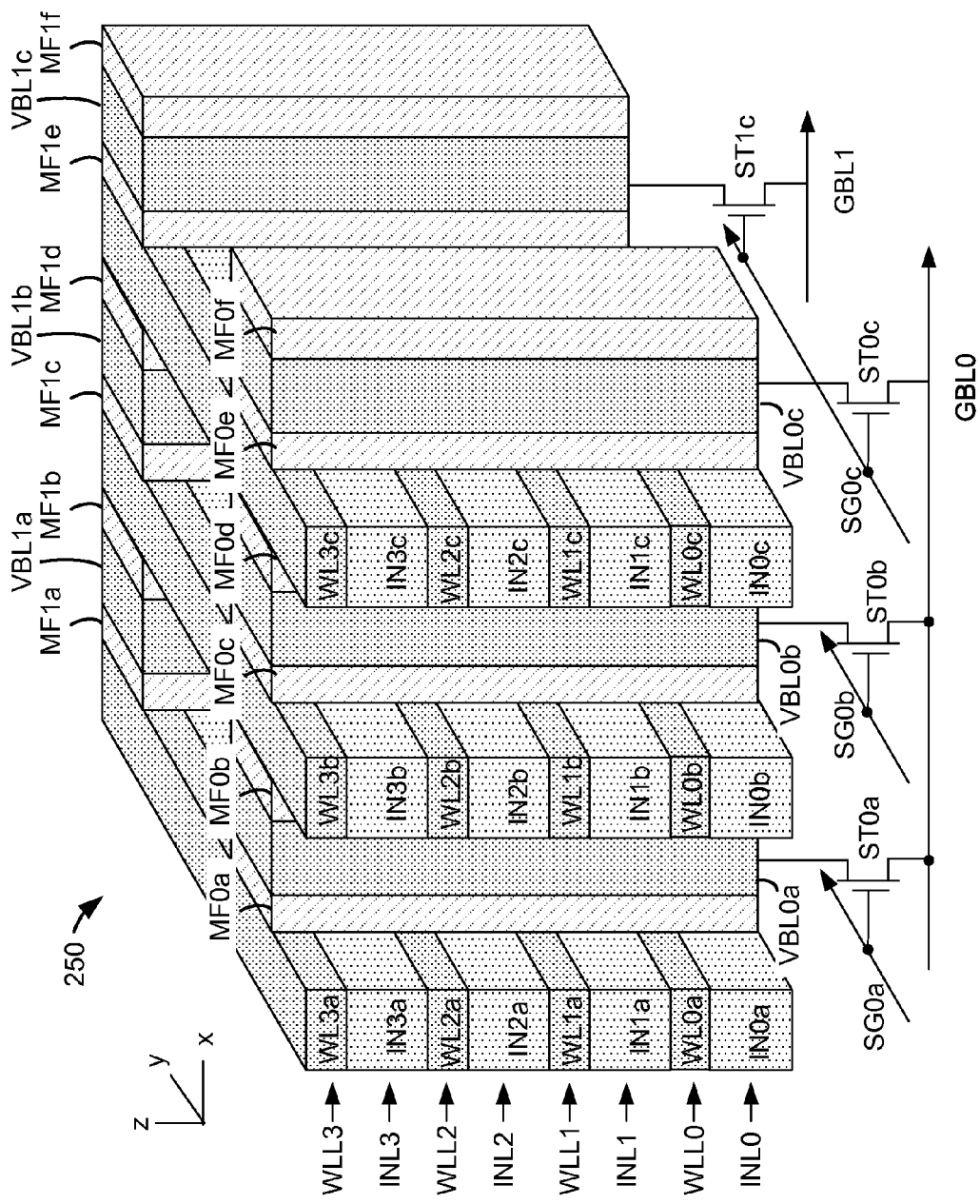
FIG. 2B depicts an example three-dimensional memory structure 250 and set of global bit lines in the memory structure of FIG. 1.

FIG. 2B depicts an example three-dimensional memory structure 250 and set of global bit lines (GBLs) in the memory structure of FIG. 1. The array includes stacked and alternating layers of an insulating material (insulation layers INL0, INL1, INL2 and INL3) and a conductive material (word line layers WLL0, WLL1, WLL2 and WLL3). For example, INL0 includes insulation portions IN0a, IN0b and IN0c. WLL0 includes word line portions WL0a, WL0b and WL0c. INL1 includes insulation portions IN1a, IN1b and IN1c. WLL1 includes word line portions WL1a, WL1b and WL1c. INL2 includes insulation portions IN2a, IN2b and IN12. WLL2 includes word line portions WL2a, WL2b and WL2c. INL3 includes insulation portions IN3a, IN3b and IN3c. WLL3 includes word line portions WL3a, WL3b and WL3c. Memory films are provided between the stacked layers and the vertical bit lines. The memory films include MF0a and MF0b on either side of a vertical bit line VBL0a, MF0c and MF0d on either side of VBL0b, MF0e and MF0f on either side of VBL0c, MF1a and MF1b on either side of VBL1a, MF1c and MF1d on either side of VBL1b, and MF1e and MF1f on either side of VBL1c.

Each vertical bit line can be selectively connected at its bottom to a global bit line via a selection transistor. For example, VBL0a, VBL0b and VBL0c can be connected to GBL0 via a selection transistors ST0a, ST0b and ST0c, respectively, which are controlled by select gates SG0a, SG0b and SG0c, respectively. Further, VBL1c can be connected to GBL1 via a selection transistor ST1c (which has the select gate SG0c). The selection transistors for VBL1a and VBL1b are not depicted.

Memory cells are formed by regions in which the word lines layers and vertical bit lines intersect. In one approach, resistance-switching cells may be provided.

The global bit lines may extend in a substrate parallel to one another and directly under the selection transistors and vertical bit lines. The global bit lines are examples of conductive lines which may be formed using techniques described herein. Many other examples are possible.

Figure 3:
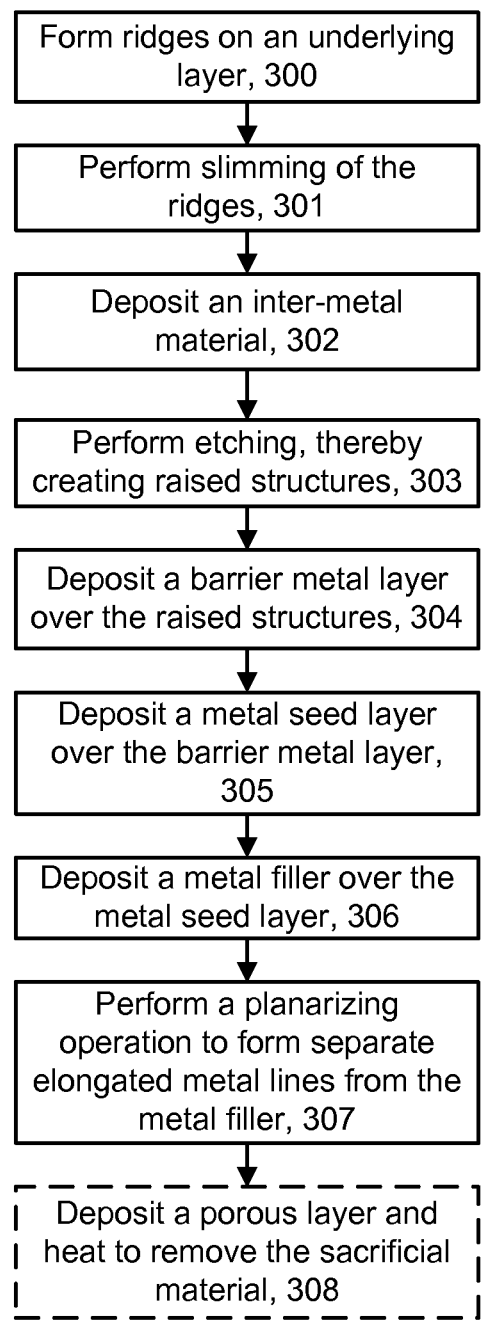
FIG. 3 depicts an example process for creating conductive lines such as the bit lines and global bit lines of FIGS. 2A and 2B, respectively.

FIG. 3 depicts an example process for creating conductive lines such as the bit lines and global bit lines of FIGS. 2A and 2B, respectively. Step 300 includes forming ridges in an insulation layer. See, e.g., FIG. 4A. The insulation layer can comprise SiO2 formed from Tetraethyl Orthosilicate (TEOS), for example. This step results in a base pattern. The insulation layer can be patterned using techniques such as Double Spacer Assisted Patterning or Self-Aligned Double Patterning. Both processes are applied to patterning of fine pitch inter-metal dielectric films.

Step 301 includes performing slimming of the ridges. See, e.g., FIG. 4B. This can involve an etch process which reduces the width of each ridge. Each slimmed ridge has a tapered shape and extends down from a peak to a base. Concave walls (e.g., sidewalls) are created on opposing sides of each ridge. By slimming the ridges, space is made for depositing an inter-metal material while maintain the pitch between ridges.

Step 302 includes depositing an inter-metal material on the slimmed ridges. For example, the inter-metal material can be a low-k material or a sacrificial material. Example deposition techniques which can be used include chemical vapor deposition (CVD), atomic layer deposition (ALD), and ultra-low temperature (ULT) deposition. These techniques are suitable for fabricating NAND bit lines. In other cases, films such as spin-on glass (SOG) which are deposited using spin coating are also suitable. See, e.g., FIG. 4C. The inter-metal material can easily adhere to the slimmed ridges due to the relatively large surface area of the sidewalls.

The inter-metal material may comprise a low-k film having a dielectric constant of less than 3.9, for instance, or less than 2.7-3.1. Examples of low-k materials include oxide derivatives which include: F-doped oxides (deposited using CVD, k=3.3-3.9), C-doped oxides (deposited using SOG or CVD, k=2.8-3.5), H-doped oxides (deposited using SOG, k=2.5-3.3. Organic low-k materials include: polyimides (spin-on, k=3.0-4.0, aromatic polymers (spin-on, k=2.6-3.2), vapor-deposited parylene with k=2.7, parylene-F with k=2.3, F-doped amorphous carbon with k=2.3-2.8, and Teflon/PTFE (spin-on) with k=1.9-2.1.

For example, one approach to providing a low-k material is to dope $SiO_2$ with fluorine to provide fluorinated silica glass with k=3.5. Another approach is to dope $SiO_2$ with carbon to achieve k=3.0. Another approach is to provide porous $SiO_2$ to achieve k<2. A lower k is achieved with a higher porosity. The pores are introduced by heating. Another example is to provide porous carbon-doped silicon dioxide. By UV curing, floating methyl groups in carbon doped silicon dioxide can be eliminated and pores can be introduced. In another example, stacking structures, e.g., layers of different materials, can be used.

The low-k material could also be a highly porous oxide such as xerogels/aerogels with k=1.8-2.5. An aerogel is a porous nanostructure of silica molecules that is approximately 90-99% air by volume. It is formed by a highly cross-linked polymerization reaction and a drying phase. The polymerization process forms a solid silica network surrounded by a sol-gel liquid. The drying process removes the liquid and leaves behind a delicate structure with nanoscale sized pores. Aerogels originate as sol-gels. A Sol-gel is a silicon oxygen matrix formed through a polymerization reaction and surrounded by methanol and deionized water. To make an aerogel, the sol-gel solvent must be extracted and replaced with air. If the sol-gel solution is left to dry naturally it will form a xerogel, which is a high density aerogel. Formation of a xerogel is characterized by shrinkage of the gel.

Optionally, multiple films are deposited, where one or more of them are low-k films.

Examples of sacrificial materials include a thermally-degradable polymer which is spun on. Such materials are available from Dow Chemical Company, for instance.

Step 303 includes performing etching of the inter-metal material on the slimmed ridges, thereby creating raised structures. See, e.g., FIG. 4D. For example, a self-aligned Damascene process which involves reactive ion etching may be used. Generally, the etching should be sufficiently deep to expose a top surface of any plug in the insulation, to allow subsequently deposited materials to contact the plug. For example, the portion 482 of the inter-metal material IM in FIG. 4C can be etched away.

Step 304 includes depositing a barrier metal layer over the raised structures. See, e.g., FIG. 4E. The barrier layer prevents or reduces diffusion from the subsequently deposited metal filler to the $SiO_2$ ridges and low-k film. Such diffusion could alter the electrical characteristics of the semiconductor device. A barrier layer can be formed of a variety of transition metals, transition metal alloys or silicides, metal nitrides, and ternary amorphous alloys. Barrier layers such as titanium, tantalum, ruthenium, cobalt and tungsten alloys in particular have the ability to effectively reduce copper diffusion.

Step 305 includes depositing a metal seed layer over the barrier metal layer. See, e.g., FIG. 4F. The metal seed layer may be formed over the barrier layer using CVD or physical vapor deposition (PVD) to produce an adhesive surface. Electrochemical deposition may then be carried out on the metal seed layer. This is a deposition process in which metals are removed from a chemical solution and deposited on a charged surface. It is also referred to as electrochemical plating, electroplating, or electro-deposition. With PVD, atoms of a conducting material (e.g., copper) are sputtered from a target of pure material, then deposited on a substrate. Generally, the metal seed layer and the metal filler can be of the same material, e.g., copper.

Step 306 includes depositing a metal filler over the metal seed layer. See, e.g., FIG. 4G. The metal filler extends above, around and between the raised structures as a bulk film. One approach involves copper electro-plating of the semiconductor structure. Or, a copper reflow process can be performed in which copper is sputtered on and reflowed by heating to a temperature of about 200° C. to 800° C. Reflowing is suitable for filling in narrow trenches which cannot be filled by electroplating.

Step 307 includes performing a planarizing operation to form separate elongated metal lines from the metal filler. See, e.g., FIG. 4H. For example, chemical-mechanical polishing (CMP) may be performed. The planarizing removes portions of the metal filler which are above the raised structures, thus forming separate metal lines between the raised structures.

Step 308 deposits a porous layer and heats to remove the sacrificial material when it is used in step 302. See, e.g., FIG. 4I. For example, a one hour anneal at 400° C. under $N_2$ gas may be used to cause the thermally degradable polymer to be decomposed and removed from the semiconductor structure via the porous layer, leaving air gaps. The polymer breaks up into smaller monomers which are able to diffuse through the porous layer above it. The polymer sublimes, e.g., changes directly into vapor when heated. One example of the porous layer is a 7% porous BLACK DIAMOND™ hard mask deposited by chemical vapor deposition (CVD). The porous layer caps the elongated metal lines to prevent oxidation.

Figure 4A:
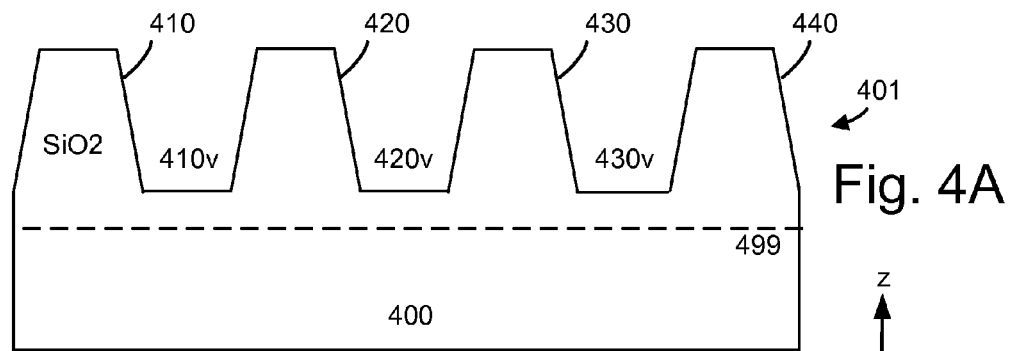
FIG. 4A depicts a semiconductor structure comprising ridges, consistent with step 300 of FIG. 3.

Generally, the porous layer is a layer of any material that has sufficient porosity to allow the sacrificial material layer to be removed through it. The porosity may be at least 3-5%, for example, the porous layer may be organic, inorganic or organic-inorganic materials. The porous layer may be a dielectric material layer such as a low-k dielectric material. Examples include: inorganic materials such as carbides, oxides, nitrides and oxyfluorides of silicon, boron, or aluminum; organic polysilica materials; silicones; silicates; silazanes; and organic materials such as benzocyclobutenes, poly (aryl esters), poly(ether ketones), polycarbonates, polyimides, fluorinated polyimides, polynorbornenes, poly (arylene ethers), polyaromatic hydrocarbons, such as polynaphthalene, polyquinoxalines, poly(perfluorinated hydrocarbons) such as poly(tetrafluoroethylene), and polybenzoxazoles. Suitable materials are commercially available under the tradenames Zirkon HM2800, TEFLON, AVATREL, BCB, AEROGEL, XEROGEL, PARYLENE F, and PARYLENE N FIG. 4A depicts a semiconductor structure 401 comprising ridges, consistent with step 300 of FIG. 3. An insulative material 400 such as SiO2 is patterned using lithograph techniques to provide ridges 410, 420, 430 and 440. The ridges are separated by valleys 410v, 420v and 430v in which conductive lines will eventually be located. The dashed line 499 is a reference elevation along the z axis which is repeated in FIGS. 4B-4I, 6A and 6B.

Figure 4B:
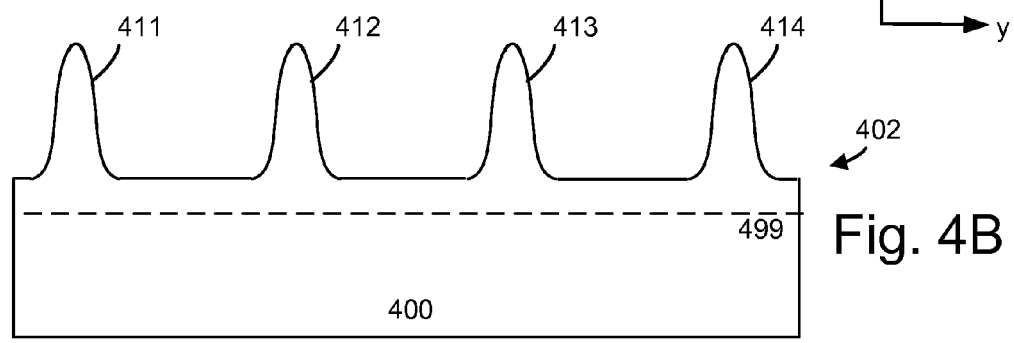
FIG. 4B depicts the semiconductor structure of FIG. 4A after performing slimming, consistent with step 301 of FIG. 3.

FIG. 4B depicts the semiconductor structure of FIG. 4A after performing slimming, consistent with step 301 of FIG. 3. A semiconductor structure 402 is formed which includes slimmed ridges 411, 412, 413 and 414. Slimming can be achieved by etching the ridges.

Figure 4C:
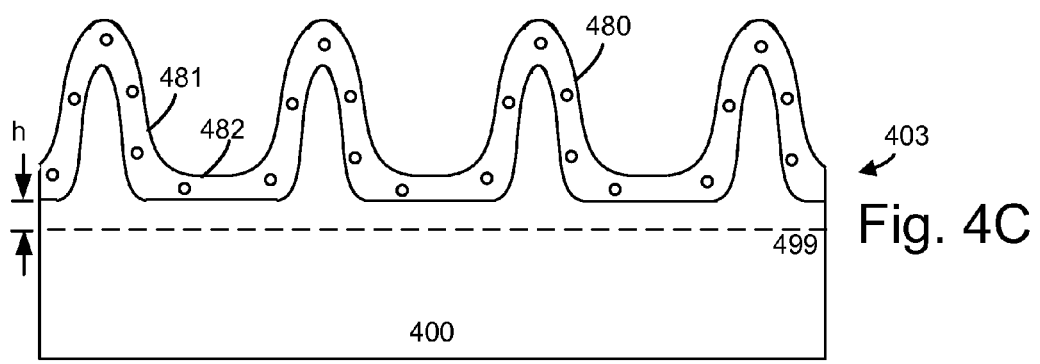
FIG. 4C depicts the semiconductor structure of FIG. 4B after depositing an inter-metal material, consistent with step 302 of FIG. 3.

FIG. 4C depicts the semiconductor structure of FIG. 4B after depositing an inter-metal material 480, consistent with step 302 of FIG. 3. A semiconductor structure 403 is formed which includes the inter-metal material IM, e.g., a film. The inter-metal material is represented in various figures by a pattern which includes small circles. The inter-metal material conforms to the ridges and the valleys of the patterned insulation 400. A height h is a distance between a bottom of the ridges and the reference elevation. A portion 481 of the inter-metal material is on a sidewall of the ridge 411, and a portion 482 of the inter-metal material is between ridges, on the insulation 400.

Figure 4D:
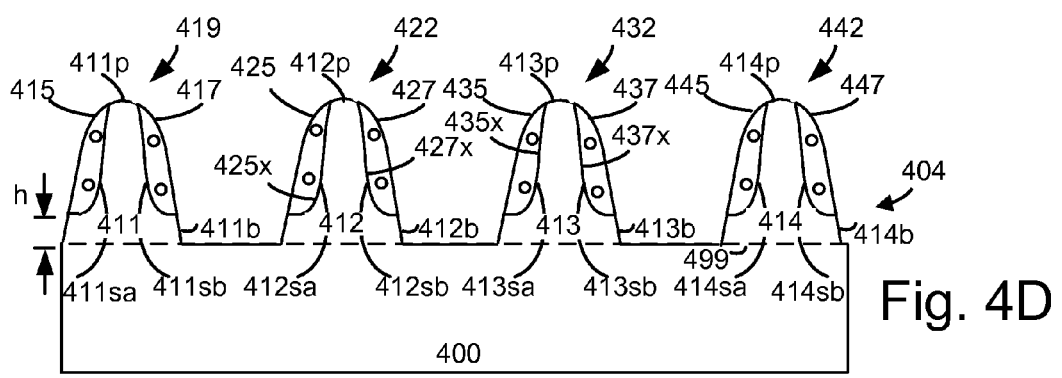
FIG. 4D depicts the semiconductor structure of FIG. 4C after performing etching, consistent with step 303 of FIG. 3.

FIG. 4D depicts the semiconductor structure of FIG. 4C after performing etching, consistent with step 303 of FIG. 3. The etching results in raised structures 419, 422, 432 and 442 in a semiconductor structure 404. After the etching, portions of the inter-metal material which are between the ridges (e.g., portion 482) are etched through, exposing the insulation 400, in one approach. Each raised structure comprises a ridge, and portions of the inter-metal material on opposing sidewalls of each ridge. Further, each sidewall of a ridge may be concave, and each portion of the inter-metal material corresponds in shape to the shape of the concave sidewall. An advantage of a concave sidewall is that it provides a large surface area to adhere to the inter-metal film, compare to a flat surface. Further, the portions of the inter-metal material on the opposing sides of a slimmed ridge comprise convex sidewalls which correspond to the concave sidewalls of the slimmed ridge.

For example, the raised structure 419 includes portions 415 and 417 of the inter-metal material on sidewalls 411sa and 411sb, respectively, of the slimmed ridge 411. The sidewalls extend down from a peak 411p to a base 411b of the slimmed ridge.

The raised structure 422 includes portions 425 and 427 of the inter-metal material on sidewalls 412sa and 412sb, respectively, of the slimmed ridge 412. The sidewalls extend down from a peak 412p to a base 412b of the slimmed ridge. The portions 425 and 427 of the inter-metal material have convex sidewalls 425x and 427x, respectively, corresponding to a shape of the concave sidewalls 412sa and 412sb, respectively, of 422.

The raised structure 432 includes portions 435 and 437 of the inter-metal material on sidewalls 413sa and 413sb, respectively, of the slimmed ridge 413. The sidewalls extend down from a peak 413p to a base 413b of the slimmed ridge. The portions 435 and 437 of the inter-metal material have convex sidewalls 435x and 437x, respectively, corresponding to a shape of the concave sidewalls 413sa and 413sb, respectively, of 432.

The raised structure 442 includes portions 445 and 447 of the inter-metal material on sidewalls 414sa and 414sb, respectively, of the slimmed ridge 414. The sidewalls extend down from a peak 414p to a base 414b of the slimmed ridge.

Figure 4E:
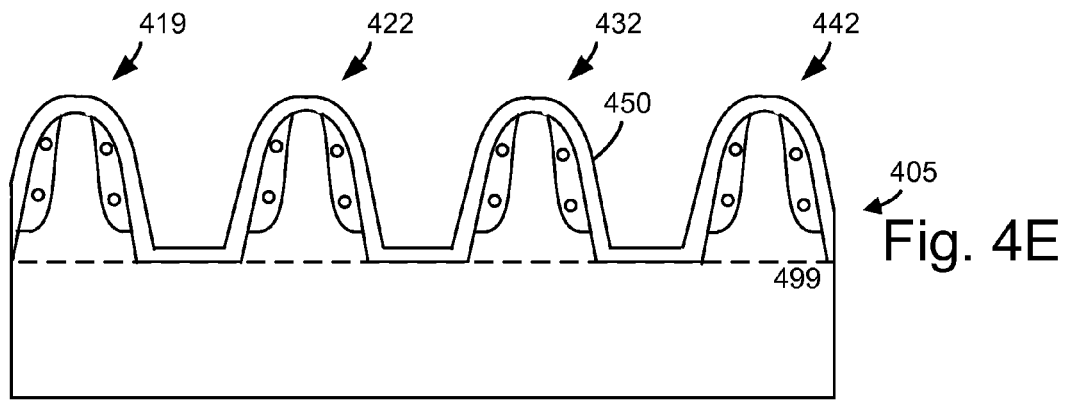
FIG. 4E depicts the semiconductor structure of FIG. 4D after depositing a barrier metal, consistent with step 304 of FIG. 3.

FIG. 4E depicts the semiconductor structure of FIG. 4D after depositing a barrier metal, consistent with step 304 of FIG. 3. A semiconductor structure 405 is formed in which a barrier metal film 450 is deposited on the raised structures 412, 422, 432 and 442.

Figure 4F:
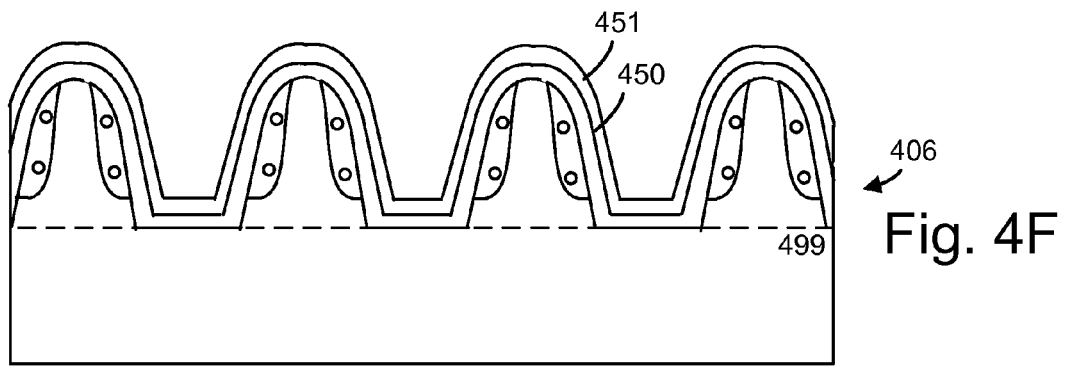
FIG. 4F depicts the semiconductor structure of FIG. 4E after depositing a metal seed layer, consistent with step 305 of FIG. 3.

FIG. 4F depicts the semiconductor structure of FIG. 4E after depositing a metal seed layer, consistent with step 305 of FIG. 3. A semiconductor structure 406 is formed in which a metal seed layer SL1 is deposited on the barrier metal film 450.

Figure 4G:
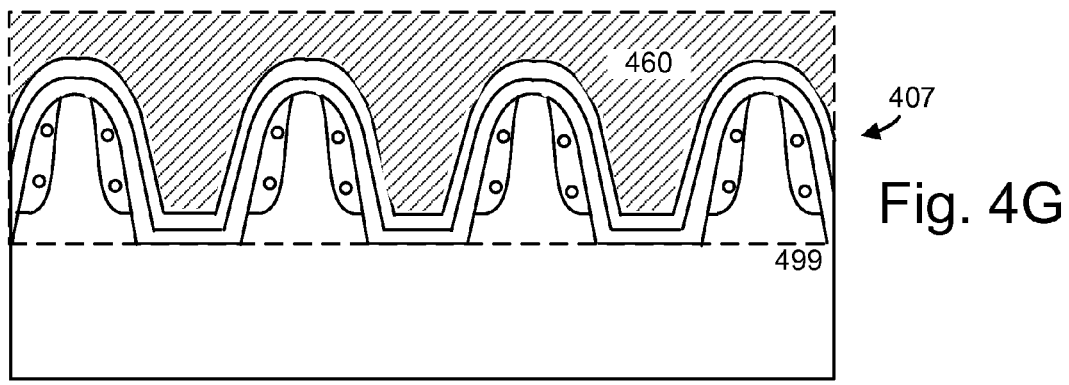
FIG. 4G depicts the semiconductor structure of FIG. 4F after depositing a metal filler, consistent with step 306 of FIG. 3.

FIG. 4G depicts the semiconductor structure of FIG. 4F after depositing a metal filler, consistent with step 306 of FIG. 3. A semiconductor structure 407 is formed in which a metal filler 460 extends above, around and between the raised structures.

Figure 4H:
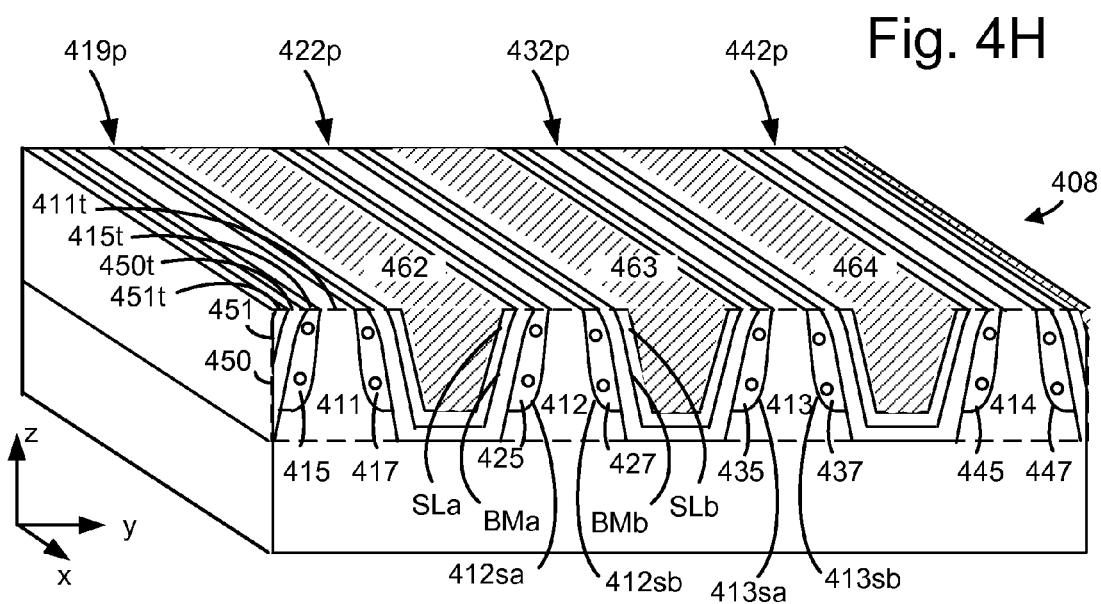
FIG. 4H depicts the semiconductor structure of FIG. 4G in a perspective view after planarizing consistent with step 307 of FIG. 3.

FIG. 4H depicts the semiconductor structure of FIG. 4G in a perspective view after planarizing consistent with step 307 of FIG. 3. A semiconductor structure 408 is formed in which portions of the metal filler become elongated metal conductive lines 462, 463 and 464. In this example, the metal lines are parallel and spaced apart from one another. The planarizing results in planarized raised structures 419p, 422p, 432p and 442p. Top surfaces of the slimmed ridges, inter-metal material, barrier metal layer and seed layers are exposed. For example, for the planarized raised structure 419p, the top surfaces 411t, 415t, 450t and 451t of the slimmed ridge 411, the inter-metal material 415, the barrier metal layer 450 and the seed layer 451, respectively, are exposed.

A depth of the planarizing can be set so that it stops at a selected elevation. Generally, the planarizing should be sufficiently deep so that it removes the metal filler, seed layer and barrier metal layer above the raised structures and forms separated metal lines on either side of each raised structure or ridge, where there is no conductive path between the separated metal lines via the raised structure. The planarizing can proceed down so that a top portion of the slimmed ridges 411, 412, 413 and 414 is removed. The planarizing could also remove a top portion of the inter-metal material 415, 417, 425, 427, 435, 437, 445 or 447. Generally, the planarizing will stop before it reaches down to the bases of the slimmed ridges and before it removes a substantial portion of the inter-metal material.

Figure 4I:
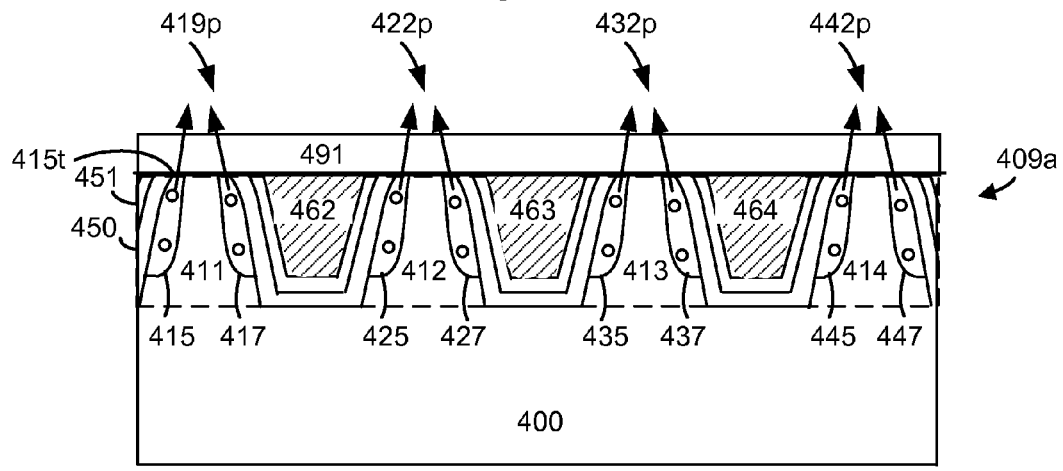
FIG. 4I depicts the semiconductor structure of FIG. 4F during heating in which the sacrificial material diffuses through a porous layer 491, consistent with step 308 of FIG. 3.

FIG. 4I depicts the semiconductor structure of FIG. 4F during heating in which the sacrificial material diffuses through a porous layer 491, consistent with step 308 of FIG. 3. A semiconductor structure 409a includes the porous layer 491 formed above the planarized raised structures and the elongated metal conductive lines. The angled arrows represent the sacrificial material being removed from the planarized raised structures.

Figure 4J:
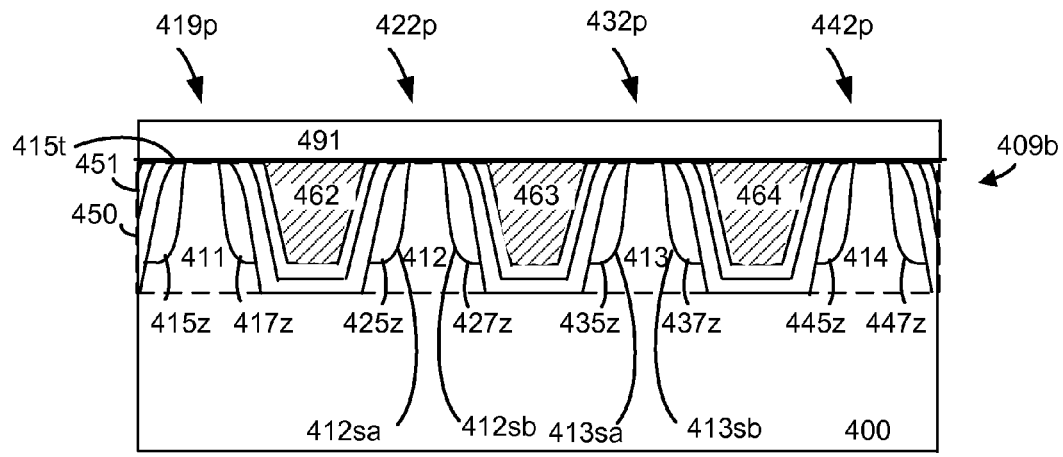
FIG. 4J depicts the semiconductor structure of FIG. 4I after the heating such that air gaps are formed in the raised structures 419p, 422p, 432p and 442p.

FIG. 4J depicts the semiconductor structure of FIG. 4I after the heating such that air gaps are formed in the planarized raised structures 419p, 422p, 432p and 442p. A semiconductor structure 409b is formed. Air gaps are present instead of low-k film portions on the sidewalls of the slimmed ridges. For example, air gaps 415z and 417z are adjacent to the sidewalls 411sa, 411sb of the slimmed ridge 411, air gaps 425z and 427z are adjacent to the sidewalls 412sa, 412sb of the slimmed ridge 412, air gaps 435z and 437z are adjacent to the sidewalls 413sa, 413sb of the slimmed ridge 413, and air gaps 445*z* and 447*z* are adjacent to the sidewalls of the slimmed ridge 414. The dielectric constant of air is 1.0, which is the lowest dielectric constant possible. The barrier metal layer 450 and the metal seed layer 451 are also depicted.

Figure 6A:
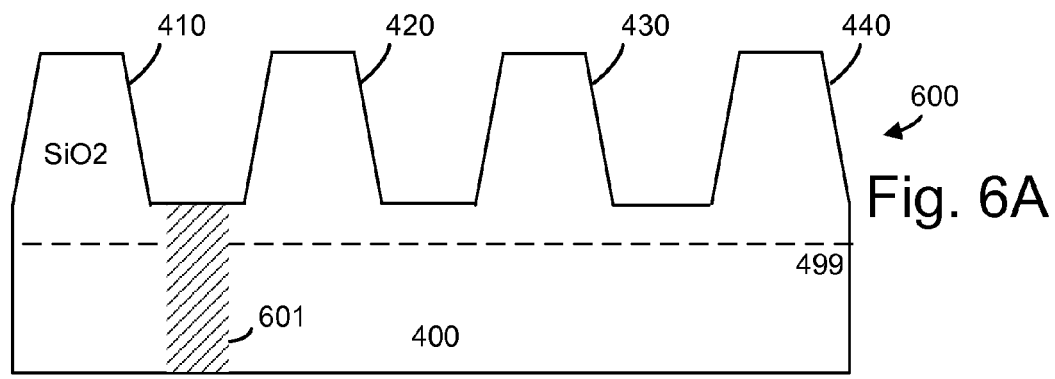
FIG. 6A depicts the semiconductor structure of FIG. 4A, where a tungsten plug 601 is formed in the insulation 400.

FIG. 6A depicts the semiconductor structure of FIG. 4A, where a tungsten plug 601 is formed in the insulation 400. A semiconductor structure 600 is provided. In some cases, vertical contacts or plugs are provided in the insulation to make contact with the horizontal conductive lines which are to be formed. A plug is an interconnect material between different layers of a semiconductor device. For example, the plug 601 is provided between the ridges 410 and 420 and is meant to provide a conductive path to the conductive line MF1. The vertical contact 221 of FIG. 2A is also an example of a plug. In this case, the fabrication proceeds as discussed. In the etching step of FIG. 4C, the portion 482 of the inter-metal material between ridges, on the insulation 400, should be removed to ensure that the subsequently deposited barrier metal is in contact with a top surface of the plug. Since the barrier metal and the metal seed layer are conductive, they provide a conductive path from the plug 601 to the conductive line 462.

Figure 6B:
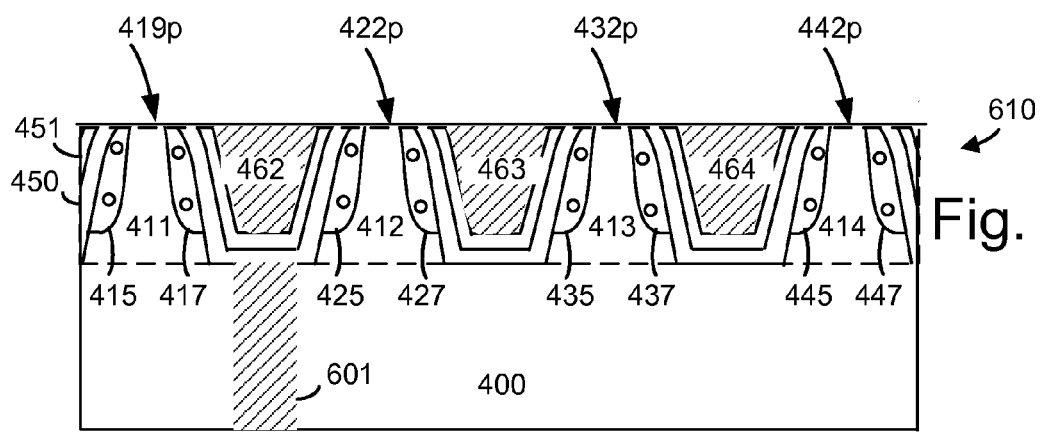
FIG. 6B depicts the semiconductor structure of FIG. 4H where the tungsten plug 601 is present, consistent with FIG. 6A.

FIG. 6B depicts the semiconductor structure of FIG. 4H where the tungsten plug 601 is present, consistent with FIG. 6A. A semiconductor structure 610 is provided. As mentioned, the plug 601 is electrically connected to the conductive line 462 via the barrier metal 450 and the metal seed layer 451.

Accordingly, it can be seen that, in one embodiment, a method for fabricating a semiconductor structure comprises: patterning an insulation layer (400) carried on a substrate (200), where the patterning forms at least first and second ridges (420, 430) in the insulation layer which are spaced-apart from one another; slimming the first and second ridges to form first and second slimmed ridges (412, 413), respectively; and depositing an inter-metal material (IM), where the inter-metal material conforms to a shape of the first and second slimmed ridges. The method further includes performing an etching operation, where the etching operation etches through portions (482) of the inter-metal material, resulting in a first raised structure (422) comprising portions of the inter-metal material (425, 427) on opposing sides (412*sa*, 412*sb*) of the first slimmed ridge and a second raised structure (432) comprising portions of the inter-metal material (435, 437) on opposing sides (432*a*, 432*b*) of the second slimmed ridge. The method further includes: providing a barrier metal layer (450), the barrier metal layer conforming to a shape of the first and second raised structures; providing a metal filler (MF) over the barrier metal layer, the metal filler extending above and between the first and second raised structures; and performing a planarizing operation. The planarizing operation results in planarizing of the first and second raised structures to form first and second planarized structures (422*p*, 432*p*), respectively, and planarizing of the metal filler to form a remaining portion of the metal filler as an elongated conductive line (462) which extends between, but not above, the first and second planarized structures.

When the inter-metal material is a sacrificial material, the method further comprises removing the portions of the inter-metal material on the opposing sides of the first slimmed ridge, resulting in air gaps (425*z*, 427*z*) on the opposing sides of the first slimmed ridge 412. The method further comprises removing the portions of the inter-metal material on the opposing sides of the second slimmed ridge, resulting in air gaps (435*z*, 437*z*) on the opposing sides of the second slimmed ridge 413.

The first slimmed ridge (412) comprises a peak or top surface (412*p*) and opposing concave sidewalls (412*sa*, 412*sb*) extending down from the peak of the first slimmed ridge (412) to a base (412*b*) of the first slimmed ridge. The second slimmed ridge comprises a peak (413*p*) and opposing concave sidewalls (413*sa*, 413*sb*) extending down from the peak of the second slimmed ridge to a base (413*b*) of the second slimmed ridge.

The portions of the inter-metal material (425, 427) on the opposing sides of the first slimmed ridge (412) comprise convex sidewalls (425*x*, 427*x*) extending from the peak of the first slimmed ridge down to the base of the first slimmed ridge; and the portions of the inter-metal material (435, 437) on the opposing sides of the second slimmed ridge (413) comprise convex sidewalls (435*x*, 437*x*) extending from the peak of the second slimmed ridge down to the base of the second slimmed ridge.

In another embodiment, a semiconductor structure comprises: a first insulative ridge (412) comprising a peak (412*p*), a first concave sidewall (412*sa*) extending from the peak of the first insulative ridge down to a base (412*b*) of the first insulative ridge, and a second concave sidewall (412*sb*) extending from the peak of the first insulative ridge down to the base of the first insulative ridge, the first concave sidewall faces away from the second concave sidewall; a first elongated metal line (462) on one side of the first insulative ridge; a second elongated metal line (463) on another side of the first insulative ridge, and spaced apart from the first elongated metal line; a first portion (BMa) of a barrier metal (450) between the first elongated metal line (462) and the first concave sidewall (422*a*); a second portion (BMb) of the barrier metal between the second elongated metal line (463) and the second concave sidewall (422*b*); a low-k dielectric material (425) between the first concave sidewall and the first portion of the barrier metal; and a low-k dielectric material (427) between the second concave sidewall and the second portion of the barrier metal.

Additionally, a first portion (SLa) of a metal seed material is between the first portion of the barrier metal and the first elongated metal line; and a second portion (SLb) of the metal seed material between the second portion of the barrier metal and the second elongated metal line.

In another embodiment, a method for fabricating a semiconductor structure comprises: patterning an insulation layer carried on a substrate, the patterning forms a first ridge in the insulation layer; slimming the first ridge to form a first slimmed ridge; depositing an inter-metal material, the inter-metal material conforming to a shape of the first slimmed ridge; performing an etching operation, the etching operation etches through portions of the inter-metal material, resulting in a first raised structure comprising portions of the inter-metal material on opposing sides of the first slimmed ridge; providing a barrier metal layer, the barrier metal layer conforming to a shape of the first raised structure; providing a metal filler over the barrier metal layer, the metal filler extending over the first raised structure, on one side of the first raised structure and on another side of the first raised structure; and performing a planarizing operation, where the planarizing operation results in planarizing of the metal filler to form one remaining portion of the metal filler as a first elongated conductive line on the one side of the first raised structure and another remaining portion of the metal filler as a second elongated conductive line on the another side of the first raised structure.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for fabricating a semiconductor structure, comprising:
    patterning an insulation layer carried on a substrate, the patterning forms at least first and second ridges in the insulation layer which are spaced-apart from one another;
    slimming the first and second ridges to form first and second slimmed ridges, respectively;
    depositing an inter-metal material, the inter-metal material conforming to a shape of the first and second slimmed ridges;
    performing an etching operation, the etching operation etches through portions of the inter-metal material, resulting in a first raised structure comprising portions of the inter-metal material on opposing sides of the first slimmed ridge and a second raised structure comprising portions of the inter-metal material on opposing sides of the second slimmed ridge;
    providing a barrier metal layer, the barrier metal layer conforming to a shape of the first and second raised structures;
    providing a metal filler over the barrier metal layer, the metal filler extending above and between the first and second raised structures; and
    performing a planarizing operation, the planarizing operation results in:
        planarizing of the first and second raised structures, respectively,
        planarizing of the metal filler to form a remaining portion of the metal filler as an elongated conductive line which extends between, but not above, the first and second raised structures,
        removal of portions of the inter-metal material and the barrier metal layer above the first and second slimmed ridges, and
        removal of top portions of the slimmed ridges, wherein the planarizing operation stops at a selected elevation at which top surfaces of the first and second slimmed ridges, top surfaces of the inter-metal material, and top surfaces of the barrier metal layer are exposed.

2. The method of claim 1, wherein:
    the inter-metal material comprises a film having a dielectric constant of less than 3.9.

3. The method of claim 1, wherein the planarizing operation stops at a selected elevation at which top surfaces of the first and second slimmed ridges, top surfaces of the inter-metal material, and top surfaces of the barrier metal layer are exposed, the method further comprising:
    depositing a porous layer above the top surfaces of the first and second slimmed ridges, the top surfaces of the inter-metal material, and the top surfaces of the barrier metal layer; and
    applying heat to cause diffusion of the portions of the inter-metal material on the opposing sides of the first slimmed ridge through the porous layer, resulting in air gaps on the opposing sides of the first slimmed ridge.

4. The method of claim 3, wherein:
    the inter-metal material is a sacrificial material, and the sacrificial material comprises a thermally-degradable polymer.

5. The method of claim 1, wherein:
    the first slimmed ridge comprises a peak and opposing concave sidewalls extending down from the peak of the first slimmed ridge to a base of the first slimmed ridge; and
    the second slimmed ridge comprises a peak and opposing concave sidewalls extending down from the peak of the second slimmed ridge to a base of the second slimmed ridge.

6. The method of claim 5, wherein:
    the portions of the inter-metal material on the opposing sides of the first slimmed ridge comprise convex sidewalls which correspond to the concave sidewalls of the first slimmed ridge; and
    the portions of the inter-metal material on the opposing sides of the second slimmed ridge comprise convex sidewalls which correspond to the concave sidewalls of the second slimmed ridge.

7. The method of claim 1, further comprising:
    providing a metal seed layer over the barrier metal layer, the metal filler is provided over the metal seed layer, and the planarizing operation removes portions of the metal seed layer above the first and second slimmed ridges.

8. The method of claim 1, wherein:
    the providing the metal filler comprises depositing the metal filler using physical vapor deposition (PVD) and reflowing the metal filler.

9. The method of claim 1, wherein:
    the metal filler comprises copper and the insulation layer comprises SiO2.

10. The method of claim 1, wherein:
    the elongated conductive line comprises a bit line in a memory device.

11. The method of claim 1, wherein:
    the inter-metal material comprises an aerogel.

12. A method for fabricating a semiconductor structure, comprising:
    patterning an insulation layer carried on a substrate, the patterning forms a first ridge in the insulation layer;
    slimming the first ridge to form a first slimmed ridge;
    depositing an inter-metal material, the inter-metal material conforming to a shape of the first slimmed ridge;
    performing an etching operation, the etching operation etches through portions of the inter-metal material, resulting in a first raised structure comprising portions of the inter-metal material on opposing sides of the first slimmed ridge;
    providing a barrier metal layer, the barrier metal layer conforming to a shape of the first raised structure;
    providing a metal filler over the barrier metal layer, the metal filler extending over the first raised structure, on one side of the first raised structure and on another side of the first raised structure; and
    performing a planarizing operation, the planarizing operation results in planarizing of the metal filler to form one remaining portion of the metal filler as a first elongated conductive line on the one side of the first raised structure and another remaining portion of the metal filler as a second elongated conductive line on the another side of the first raised structure, the planarizing operation stops at a selected elevation at which a top portion of the first slimmed ridge is exposed, and top surfaces of the first and second elongated conductive line are at the selected elevation.

13. The method of claim 12, wherein:
the inter-metal material comprises a film having a dielectric constant of less than 3.9.

14. The method of claim 12, wherein the inter-metal material is a sacrificial material, the method further comprising:
depositing a porous layer; and
applying heat to cause diffusion of the portions of the inter-metal material on the opposing sides of the first slimmed ridge through the porous layer, resulting in air gaps on the opposing sides of the first slimmed ridge.

15. The method of claim 1, wherein:
the metal filler is provided over portions of the inter-metal material and the barrier metal layer which are between the first and second slimmed ridges.

16. The method of claim 1, wherein:
a top of the conductive line is at the selected elevation; and
a bottom of the conductive line is above the portions of the inter-metal material and the barrier metal layer which are between the first and second slimmed ridges.

* * * * *